(12) United States Patent
Hildenbrand et al.

(10) Patent No.: US 8,986,559 B2
(45) Date of Patent: Mar. 24, 2015

(54) COMPOSITIONS AND METHODS FOR TEXTURING POLYCRYSTALLINE SILICON WAFERS

(71) Applicant: Avantor Performance Materials, Inc., Center Valley, PA (US)

(72) Inventors: Nicolas Hildenbrand, Deventer (NL); Joannes Theodorus Valentinus Hoogboom, Deventer (NL); Michiel Scheffer, Arnhem (NL); Raymond Albertus Johannes Ten Broeke, Raalte (NL)

(73) Assignee: Avantor Performance Materials, Inc., Center Valley, PA (US)

( * ) Notice: Subject to any disclaimer, the term of this patent is extended or adjusted under 35 U.S.C. 154(b) by 0 days.

(21) Appl. No.: 13/778,856

(22) Filed: Feb. 27, 2013

(65) Prior Publication Data

US 2013/0224898 A1     Aug. 29, 2013

Related U.S. Application Data

(60) Provisional application No. 61/604,962, filed on Feb. 29, 2012.

(51) Int. Cl.
*B29D 11/00*     (2006.01)
*C09K 13/08*     (2006.01)
*H01L 31/18*     (2006.01)
*C09K 13/10*     (2006.01)
*H01L 31/0236*   (2006.01)

(52) U.S. Cl.
CPC ............ *C09K 13/08* (2013.01); *H01L 31/1804* (2013.01); *C09K 13/10* (2013.01); *H01L 31/02363* (2013.01); *Y02E 10/50* (2013.01)
USPC .............................. 216/24; 216/99; 252/79.2

(58) Field of Classification Search
CPC ................... H01L 31/02363; H01L 31/1804; H01L 21/67086; Y02E 10/50; C09K 13/08
USPC ...................... 216/24, 99; 252/79.2
See application file for complete search history.

(56) References Cited

U.S. PATENT DOCUMENTS

2003/0230548 A1* 12/2003 Sievert et al. .................... 216/2

* cited by examiner

*Primary Examiner* — Roberts Culbert
(74) *Attorney, Agent, or Firm* — Hoffmann & Baron, LLP

(57) ABSTRACT

Compositions and methods for chemical texturing a surface of a polycrystalline silicon wafer to be used in the manufacture of solar cells provide increased efficiency in the manufacture and operation of solar cells. The compositions and methods disclosed herein include first and second components, wherein the first component is a UKON etch composition, including a hydrofluoric acid/nitric acid mixture and water, while the second component includes a silicon wafer texturing enhancer (SWTE).

24 Claims, 2 Drawing Sheets

COMPOSITIONS AND METHODS FOR TEXTURING POLYCRYSTALLINE SILICON WAFERS

CROSS REFERENCE TO RELATED APPLICATIONS

This application claims the benefit of priority to U.S. Provisional Application Ser. No. 61/604,962, filed Feb. 29, 2012, the content of which is incorporated herein in its entirety by reference.

BACKGROUND OF THE INVENTION

The present invention relates to acidic etching compositions and methods useful for texturing the surface of silicon substrates, particularly for polycrystalline, or multicrystalline silicon wafers used in manufacturing solar cells.

Renewable energy sources are considered to be green or clean energy sources having a much lower environmental impact than conventional fossil based energy sources. Of the renewable sources, solar energy is the most abundant energy resource on earth. Photovoltaic energy in particular is becoming a more reliable and readily available source of generating electricity. Currently the most used material for the manufacturing of solar cells is crystalline silicon.

Optical losses due to the reflectance of incident solar radiation are one of the most significant factors that limit solar efficiency. Lowering the surface reflection of silicon wafers by texturization is practiced in order to improve a solar cell's efficiency. Increased light absorption from a better-textured silicon surface will result in higher currents from the cell, which can result in higher efficiency of the solar cell.

Texturing is a means of creating a certain roughness at the surface of a substrate in order to enable multiple reflection of light incident on its surface, thereby leading to greater absorption of the light inside the substrate, i.e., to an increased light-confining effect. The roughness obtained in this way has two complementary effects: the first effect is to reduce the reflecting power or optical reflectivity of the surface; the second effect is to increase the length of the optical path travelled by the incident light inside the substrate. In a photocell, photovoltaic cell or solar cell, the increased light-confining effect gives rise to an increase in the effectiveness with which light is transformed into electricity.

Customarily, the roughness or texture of the surface of a substrate, in particular of a silicon or silicon alloy substrate or wafer may include randomized pyramids or a multitude of pits having a depth in the range of from 0.1 to 10 μm and a diameter in the range of from 0.1 to 10 μm.

Various methods have been proposed for texturing the surface of the substrates, including mechanical engraving, laser etching, photolithography, masking, sandblasting, mortizing, anodic oxidation, sputter etching, etc. However, these methods are complex and expensive to implement.

The single crystal silicon substrates are mainly produced by sawing massive silicon ingots. However, crystal defects having a depth of several μm are caused by the sawing, which is known in the art as saw damage. Since these crystal defects are centers for the recombination of electron-hole pairs, it is necessary to remove them by way of so-called saw damage etch.

The method of surface texturing presently employed on an industrial scale includes the use of aqueous alkaline solutions based on sodium hydroxide or potassium hydroxide. These solutions have the property of etching silicon anisotropically depending on the crystallographic orientation of the grains situated at the surface, thereby modifying the surface morphology of the silicon. Etching speed is about 100 times greater on planes having a certain crystallographic orientation than on other planes. This causes the surface to be textured in the form of randomized pyramids consisting of the most stable Si(111) plane, that trap the incident light, which effect is referred to as "micro-texturing." For polycrystalline silicon substrates however, it is estimated that only 20% of the surface is constituted by grains having the preferred crystallographic orientation to result in pyramids. The treatment is therefore less effective with respect to optical reflectivity. This equally applies to silicon substrates manufactured by the edge defined film-fed growth (EFG) process or by the string ribbon process, which processes do not require sawing. Thus, the treatment is fully effective only in the special case of single crystal silicon substrates having a single crystallographic orientation at the surface to be etched.

In order to ameliorate these problems and drawbacks, aqueous acidic etching solutions and methods of their use have been developed.

A typical acidic process used in industry is known as the UKON etch, and consists of a mixture of hydrofluoric acid (HF), nitric acid ($HNO_3$), and water ($H_2O$) in varying amounts. See, for example, U.S. Pat. No. 5,949,123 and EP 0 773 590 B1 which disclose an aqueous acidic etching solution containing hydrofluoric acid and nitric acid in a weight ratio of 1:3. This etching solution is used for creating pores in the silicon surface resulting in a porous layer which still contains some amorphic silicon. In a second step, this amorphic silicon is removed with an alkaline solution of sodium hydroxide, thereby creating a surface texture.

U.S. Pat. No. 6,340,640 and German patent application DE 197 46 706 A1 disclose an acidic etching solution containing 12 parts by volume of 50% by weight hydrofluoric acid, one part by volume of 69% by weight nitric acid and 12 parts by volume of 85% by weight phosphoric acid. Instead of the phosphoric acid, a carboxylic acid having a higher molecular weight than acetic acid can be used. Additionally, the acidic etching solution can also contain surfactants or ammonium fluoride.

International patent application WO 01/47032 A1 discloses acidic etching solutions containing 1 to 30% by weight of hydrofluoric acid, 5 to 30% by weight of nitric acid and 50 to 94% by weight of sulfuric acid and/or phosphoric acid. The preferred composition contains 10 to 16% by weight hydrofluoric acid, 15 to 25% by weight nitric acid, 15 to 25% by weight sulfuric acid, 14 to 20% by weight phosphoric acid, and 20 to 30% by weight water. An even more preferred composition contains 3 to 7% by weight hydrofluoric acid, 3 to 7% by weight nitric acid, 75 to 85% by weight sulfuric acid, and 5 to 15% by weight water.

Japanese patent application JP 2004-063744 discloses a two-step etching process, wherein an aqueous acidic etching solution A, containing 36 to 42% by weight hydrofluoric acid and 6 to 10% by weight nitric acid, and an aqueous acidic etching solution B, containing 32 to 46% by weight hydrofluoric acid and 2 to 6% by weight nitric acid, are used.

U.S. Pat. No. 7,192,885 (international patent application WO 2004/100244 A1) discloses an aqueous acidic etching solution containing 10 to 40% by weight concentrated hydrofluoric acid, 2 to 60% by weight concentrated nitric acid, and 20 to 55% by weight water.

Japanese patent application JP 2005-31 1060 discloses an aqueous acidic etching solution containing 10 to 22% by weight hydrofluoric acid, 15 to 31% by weight nitric acid, the remainder being water.

German patent application DE 10 2007 004 060 A1 discloses an aqueous acidic solution containing 0.8 to 2% by weight hydrofluoric acid, 15 to 40% by weight nitric acid, 10 to 41% by weight sulfuric acid, the remainder being 74.2% by weight or less of water. A preferred solution contains 1 to 1.7% by weight hydrofluoric acid, 20 to 30% by weight nitric acid, 18 to 35% by weight sulfuric acid, and 61% by weight or less water. A particularly preferred solution contains 1.4% by weight hydrofluoric acid, 27% by weight nitric acid, 26% by weight sulfuric acid, and 45.6% by weight water. However, this solution is primarily used for the wet chemical edge isolation and, therefore, is used to solve a technical problem which is different from the problems of the texturing of surfaces. If it is used for this purpose, it exhibits only little etching power and leads to comparatively smooth surfaces. Additionally, several commercial aqueous acidic etching solutions are available in the market.

International application WO2011/032880 also discloses an aqueous acidic etching solution for texturing both single crystal and polycrystalline silicon wafers. The etching solution includes 3 to 10% by weight hydrofluoric acid, 10 to 35% by weight nitric acid, 5 to 40% by weight sulfuric acid, and 55 to 82% by weight water.

Products used in such etching includes, for example, Spin-Etch™ BT which contains 10 to 20% by weight hydrofluoric acid, 20 to 30% by weight nitric acid, 15 to 25% by weight sulfuric acid and 10 to 20% by weight phosphoric acid, the remainder being 35% by weight or less water. Si-Polish-Etch™ I contains 5 to 10% by weight hydrofluoric acid, 36 to 38% by weight nitric acid, 9 to 13% by weight sulfuric acid and 16 to 20% by weight phosphoric acid, the remainder being 34% by weight or less water. Spin-Etch™ D contains 1 to 7% by weight hydrofluoric acid, 35 to 45% by weight nitric acid, 10 to 20% by weight sulfuric acid and 15 to 25% by weight phosphoric acid, the remainder being 39% by weight or less water. And, Spin-Etch™ E contains 1 to 5% by weight hydrofluoric acid, 5 to 10% by weight nitric acid and 75 to 85% by weight sulfuric acid, the remainder being 19% by weight or less water.

Although these prior art aqueous acidic etching solutions are capable of ameliorating some of the problems and drawbacks associated with the aqueous alkaline etching solutions, they require constant development to improve and balance their application property profile in order to meet the demands of the market. More particularly, it is desirable to produce a silicon wafer which contributes to increased efficiency of the solar cell by being less reflective of solar rays at its surface.

Additionally, the prior art compositions and processes result in wafers with significant defect etching at grain boundaries or at areas of poorer quality on the wafer. As a result of the defects on the wafer surface, undesired charge recombination increases. Moreover, the wafers become more brittle because of the deeper etch at defects increasing the chance for breakage. Additionally, the desired texture is obtained in a very narrow window of the $HF/HNO_3/H_2O$ phase diagram which makes it difficult to control. Ideally, a texturing solution would be capable of etching off a higher amount of silicon from the wafer, whilst displaying equal or lesser amounts of defect etching. This entails removing more of the saw damage, which results in charge recombination, and avoiding problems associated with current known products, such as enhanced defect etching at deeper etch depths.

Still further with regard to additives to the UKON etch process, additional problems have arisen, such as increased foaming of the mixture and surfactants sticking to the wafers. All of these problems lead to increased contamination of the wafers, requiring, e.g., dragging in other baths and extra cleaning steps. Also, some additives, particularly fluorinated alkyl chains, present additional environmental concerns.

Because of the physical/structural differences among the number of different types of silicon wafers from varied sources (e.g., REC Singapore, REC Norway, SolarWorld, IMEC, and ECN), one acidic bath does not fit all. It is important to provide a system and compositions which can be adapted to provide an efficient texturing process for each of the varied types of polycrystalline silicon wafers.

There remains, therefore, a need for improved chemical texturing methods and compositions for polycrystalline silicon wafers, particularly those used in the manufacturing of solar cells in the photovoltaic industry.

SUMMARY

The present invention includes a silicon wafer texturing enhancer (SWTE) and composition and methods using same. The SWTE can be used in a UKON etch process, or as a supplement thereto, to enlarge the window for processing while minimizing etch defects.

In its simplest form the SWTE includes a multi-component process window enhancer, which maximizes the process window of optimal conditions for conducting an etch process, particularly a UKON etch process. The process window for optimal process conditions is identified from the phase diagram of the etch process, and can be enhanced by, for example, increasing the appropriate range of component ratios at equilibrium of the phase diagram (broadening the process window), or by decreasing the appropriate range of component ratios at equilibrium of the phase diagram (retarding the process window). A process window enhancer can therefore either broaden or retard the process window. It can further be enhanced by including a component which acts to reduce etch defects, such as by passivating surface defects such as unbound electrons or holes, which have higher reactivity towards the etching solution and therefore act as a seed for defect pit etching.

In that regard, the SWTE of the invention includes a multi-component process window enhancer which includes sulfuric acid and at least one of phosphoric acid or diethylenetriaminepentakis(methylphosphonic acid) (DTPMP). The multi-component process window enhancer improves the process by broadening the process window using sulfuric acid with another agent, such as phosphoric acid or, e.g., DTPMP. It is believed that sulfuric and phosphoric acids enlarge the window and DTPMP retards the process to effectively also reduce defect etching, which is usually observed to occur at higher etch rates. In other words, the multi-component process window enhancer provides greater control of variables than process window enhancers of the prior art. In an embodiment, the SWTE includes sulfuric acid and phosphoric acid. In another embodiment, the SWTE includes sulfuric acid and DTPMP. Other agents can be considered based on the understanding that it functions to enhance the process window of UKON etch composition and process. In another embodiment, the SWTE includes sulfuric acid, phosphoric acid, and citric acid. In yet another embodiment, the SWTE includes sulfuric acid, phosphoric acid, citric acid, and boric acid.

The SWTE can also include an etch defect passivator such as, for example, boric acid. Other agents can be considered for use as a passivator(s) based on the understanding that it (or they) act to reduce optical defects such as dark spots in the surface of the wafer and are compatible with the operation of the process window enhancer to the extent they do not interfere with their function of enhancing the process window.

Other ingredients can be included as deemed appropriate and the invention is not constrained by the possibility of having additional components. Such component(s) will not interfere with, or at least minimally affect the function of the process window enhancer and/or etch defect passivator. For example, in certain cases, citric acid has been added as an additional component.

The SWTE typically is added to a UKON etch process which includes a UKON etch composition of a hydrofluoric acid/nitric acid mixture and water, where the UKON etch process composition has a ratio of hydrofluoric acid/nitric acid of from about 0.250 to about 0.550.

Additionally a method of chemically texturing a surface of a polycrystalline silicon wafer is disclosed. The method includes contacting the surface of said polycrystalline silicon wafer with a composition for a time and at a temperature sufficient to texturize said wafer surface, the composition includes a first component and a second component. The first component has a hydrofluoric acid/nitric acid mixture and water, and the second component is the SWTE is as set forth above. The process and composition can be in the nature of a UKON etch process.

In one embodiment, the method takes place under conditions wherein a surface of the wafer is contacted with the composition at a temperature of about 2° C. to about 30° C. for a period of time of about 20 seconds to about 90 seconds. In another embodiment, the method takes place at a temperature of about 12° C. to about 16° C. for a period of time of about 30 seconds to about 60 seconds.

In one embodiment the SWTE includes water, sulfuric acid, citric acid, and phosphoric acid. In this embodiment, sulfuric acid can be from about 3.00% to about 11.00% by weight of the SWTE, citric acid can be from about 4.00% to about 12.00% by weight of the SWTE, phosphoric acid can be from about 35.00% to about 45.00% by weight of the SWTE, while water is present in the amount of from about 40.00% to about 50.00% by weight of the SWTE. This embodiment is particularly useful with a Deutsche Cell silicon wafer.

In a preferred embodiment, sulfuric acid can be from about 5.00% to about 8.00% by weight of the SWTE, citric acid can be from about 6.00% to about 10.00% by weight of the SWTE, phosphoric acid can be from about 38.00% to about 42.00% by weight of the SWTE, while water is present in the amount of from about 42.00% to about 46.00% by weight of the SWTE.

In another embodiment, the SWTE includes water, sulfuric acid, citric acid, phosphoric acid, and boric acid. In this embodiment, sulfuric acid can be from about 1.00% to about 3.25% by weight of the SWTE, citric acid can be from about 1.50% to about 3.75% by weight of the SWTE, phosphoric acid can be from about 8.00% to about 18.00% by weight of the SWTE, boric acid can be from about 1.5% to about 3.75% by weight of the SWTE, while water is present in an amount of from about 74.00% to about 84.00% by weight of the SWTE. This embodiment is particularly useful with a Deutsche Cell silicon wafer.

In a preferred embodiment, sulfuric acid can be from about 1.75% to about 2.75% by weight of the SWTE, citric acid can be from about 2.00% to about 3.25% by weight of the SWTE, phosphoric acid can be from about 11.00% to about 15.00% by weight of the SWTE, boric acid can be from about 2.0% to about 3.25% by weight of the SWTE, while water is present in an amount of from about 76.00% to about 82.00% by weight of the SWTE.

In another embodiment, the SWTE includes water, sulfuric acid, and DTPMP. In this embodiment, sulfuric acid can be from about 3.00% to about 11.00% by weight of the SWTE, DTPMP can be from about 40.00% to about 54.00% by weight of the SWTE, while water is present in an amount of from about 39.00% to about 51.00% by weight of the SWTE. This embodiment is particularly useful with a REC silicon wafer.

In yet another embodiment, the SWTE includes water, sulfuric acid, DTPMP, and boric acid. In this embodiment, sulfuric acid can be from about 1.25% to about 3.25% by weight of the SWTE, DTPMP can be from about 11.00% to about 19.00% by weight of the SWTE, boric acid can be from about 1.50% to about 3.75% by weight of the SWTE, while water is present in an amount of from about 70.00% to about 88.00% by weight of the SWTE. This embodiment is particularly useful with a REC silicon wafer.

In yet another embodiment, the SWTE includes water, sulfuric acid, citric acid, DTPMP, and phosphoric acid. In this embodiment, sulfuric acid can be from about 2.00% to about 6.00% by weight of the SWTE, citric acid can be from about 2.25% to about 6.50% by weight of the SWTE, phosphoric acid can be from about 19.00% to about 29.00% by weight of the SWTE, DTPMP can be from about 22.00% to about 32.00% by weight of the SWTE, while water is present in an amount of from about 35.00% to about 45.00% by weight of the SWTE. This embodiment is particularly useful with a REC silicon wafer.

In a further embodiment, the SWTE includes water, sulfuric acid, citric acid, DTPMP, phosphoric acid, and boric acid. In this embodiment, sulfuric acid can be from about 1.25% to about 2.75% by weight of the SWTE, citric acid can be from about 1.50% to about 3.25% by weight of the SWTE, phosphoric acid can be from about 6.00% to about 16.50% by weight of the SWTE, DTPMP can be from about 8.00% to about 18.00% by weight of the SWTE, boric acid can be from about 1.50% to about 2.25% by weight of the SWTE, while water is present in an amount of from about 58.00% to about 78.00% by weight of the SWTE. This embodiment is particularly useful with a Deutsch Cell silicon wafer.

In yet another embodiment, a composition for chemical texturing a surface of a polycrystalline silicon wafer is provided. The composition includes first component and a second component. The first component includes a hydrofluoric acid/nitric acid mixture and water, and the second component is the SWTE as set forth above. The composition can be in the nature of a UKON etch composition.

It is an advantage of the present invention to provide a silicon wafer texturing enhancer, thus providing an improved chemical texturing process for multicrystalline silicon wafers, and an improved multicrystalline silicon wafer as a result thereof. It is also an advantage of the present invention to provide a more efficient solar cell because of the improved etching process.

For a better understanding of the present invention, together with other and further objects and advantages, reference is made to the following detailed description, taken in conjunction with the accompanying examples, and the scope of the invention will be pointed out in the appended claims. The following detailed description is not intended to restrict the scope of the invention by the advantages set forth above.

DETAILED DESCRIPTION OF THE INVENTION

Figure 1:
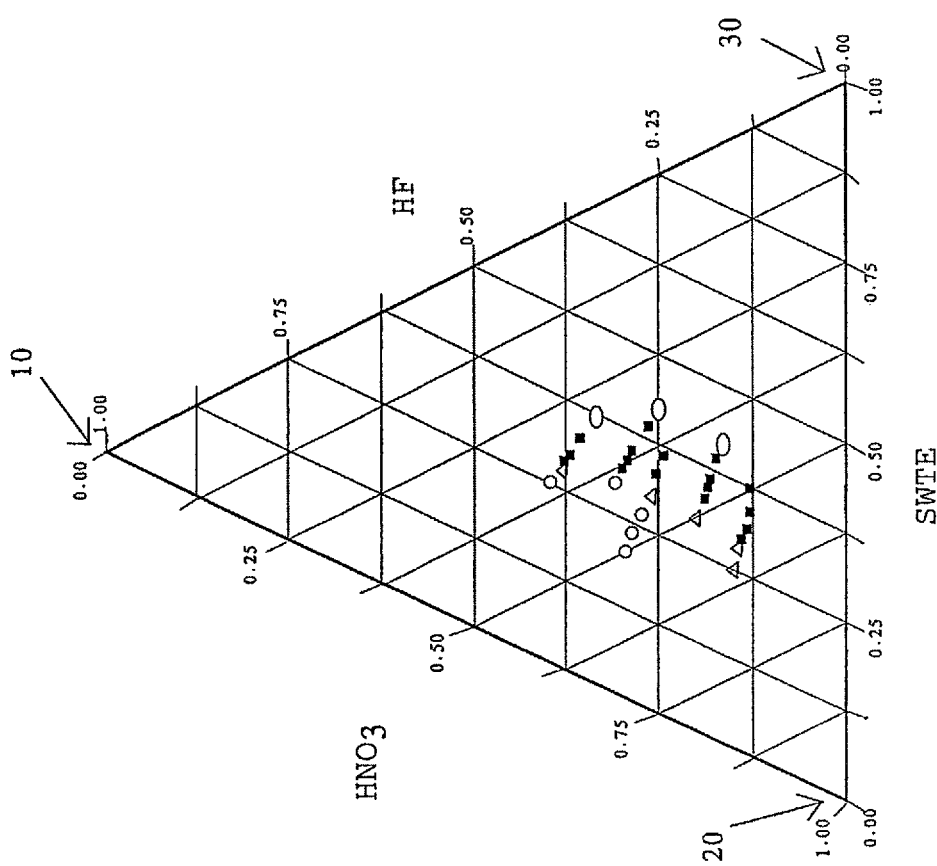
FIG. 1 is a phase diagram of the SWTE of the present invention with a UKON etch process composition.

The present invention includes compositions and methods for texturing polycrystalline, or multicrystalline silicon wafers useful in solar cells.

As used herein, the term "UKON etch process" refers to a texturing process of silicon wafers using a mixture of hydrofluoric acid and nitric acid in an aqueous solution. UKON etch process is well known in the art, and the term is broadly used herein to include all embodiments known in the art.

The present invention provides methods and compositions for chemical texturing of polycrystalline (or multicrystalline) silicon wafers, typically used in solar cells. In one embodiment, the present invention includes an SWTE to the UKON chemical texturing composition and process which substantially improves the texturing process and wafer.

The UKON etch process is typically used at various ratios of HF/HNO$_3$ and water, depending on the type of wafer being used as well as the time and temperature at which the wafer is being textured. The etch process involves combining the ingredients in a bath mixture, then heating and stirring the mixture. Additionally, a sacrificial wafer may be etched in order to activate the bath prior to actual use.

As used herein, the term, "hydrofluoric acid" refers to HF, salts, mixtures, and solutions thereof. Hydrofluoric acid typically is used in an aqueous solution, and any such aqueous solutions may be used in the present invention. In a non-limiting embodiment, an aqueous solution having from about 35% to about 65% HF by weight may be used. In a preferred embodiment, 49% HF is used.

As used herein, the term "nitric acid" refers to HNO$_3$, salts, mixtures, and solutions thereof. Nitric acid typically is used in an aqueous solution, and any such aqueous solutions of HNO$_3$ are contemplated for use in the present invention. In a non-limiting embodiment, an aqueous solution having from about 50% to about 80% HNO$_3$ by weight may be used. In a preferred embodiment, 65% HNO$_3$ is used.

As used herein, the term, "sulfuric acid" refers to H$_2$SO$_4$, salts, mixtures, and solutions thereof. Sulfuric acid typically is used in aqueous solution, and any such solutions may be used in the present invention. In a non-limiting example, an aqueous solution having from about 80% to about 100% H$_2$SO$_4$ by weight may be used. In a preferred embodiment, 99% H$_2$SO$_4$ is used.

As used herein, the term "citric acid" refers to C$_6$H$_8$O$_7$, salts, mixtures, and solutions thereof. Citric acid typically is used in white crystalline powder form.

As used herein, the term "phosphoric acid" refers to H$_3$PO$_4$, salts, mixtures, and solutions thereof. Phosphoric acid typically is used in aqueous solution, and any such solution may be used in the present invention. In a non-limiting embodiment, an aqueous solution having from about 50% to about 80% H$_3$PO$_4$ by weight may be used. In a preferred embodiment, 65% H$_3$PO$_4$ is used.

As used herein, the term "boric acid" refers to H$_3$BO$_3$, salts, mixtures, and solutions thereof. Boric acid typically is used in white crystalline powder form. Boric acid also refers to tetraboric acid, pyroboric acid, salts, mixtures, and solutions thereof.

As used herein, the term "diethylenetriaminepentakis(m-ethylphosphonic acid)," or "DTPMP" refers to a mixture of about 40% to about 60% DTPMP, about 25% to about 45% water, and about 5% to about 25% HCl.

The UKON etch process typically involves texturing polycrystalline silicon wafers to a depth of approximately 5 μm per side. It is desirable, and it has been attempted to etch at greater depths in order to optimize wafer and solar cell performance by the removal of more saw damage and microcracks in the wafer. Balancing the need for greater depth however, is the undesirable side effect of etch defects which increase in frequency at greater etch depth. Etch defects optically appear as black spots on the wafer surface, and are typically fault lines or other type of defect in the wafer. Surface defects usually have high amounts of electrons or holes on or near the wafer surface. These reactive centers are the first point of attack for the texturing solution, as they are chemically the most reactive sites, and therefore defect etching is initiated at these points in the crystal lattice. Boric acid, in particular, passivates the silicon wafer surface electrons, thus reducing defect etching.

Etch defects also adversely affect wafer and solar cell performance, and increase the wafer's brittleness, resulting in wafers which are more fragile and difficult to handle. The SWTE, composition, and process of the present invention provide a polycrystalline silicon wafer with significant reduction in etch defects. The SWTE, composition, and process of the present invention also provide wafers with deeper etching.

A Polycrystalline silicon wafer is then immersed in the bath for a time and at a temperature sufficient to etch or texture the wafer. The present invention contemplates texturing time to be between about 20 seconds to about 90 seconds, and at a temperature of about 2° C. to about 30° C. In a preferred embodiment, texturing time takes from about 30 seconds to about 60 seconds, at a temperature of about 12° C. to about 16° C.

The time, temperature, and HF/HNO$_3$ ratio of the UKON etch composition depends on a number of factors, and varies according to the type of wafer to be etched. Wafers can come from a number of different sources, including from the Renewable Energy Corporation (REC®), both REC Singapore and REC Norway; and Deutsche Cell/SolarWorld®. The main difference between these wafer sources is the amount of saw damage and required etch depth. For RE wafers, the preferred etch depth per side is about 3 micrometer, whereas that of Deutsche Cell wafers is about 5 micrometers. The present invention therefore provides different SWTEs tailored to each wafer source.

The etch process typically has a process window in which optimal conditions are achieved, and which is dictated by the phase diagram of the UKON etch composition. The SWTE of the present invention additionally enhance the UKON etch process by enhancing the process window (e.g., broadening or retarding) in order to ensure optimal etching for the particular wafer being used. It is thought that some ingredients, such as sulfuric acid and phosphoric acid, broaden the process window so that the etch process occurs over longer period of time, thereby enhancing the etch process. It is conversely believed that some ingredients, such as DTPMP retards the process window so that some wafers, such as REC® wafers, are etched at lower rates, thus ensuring less etching for these wafers, which is desired.

When the weight percentage of an ingredient is given for the SWTE, it is noted that the amount will be significantly reduced in the total bath composition, which includes the UKON etch composition and the SWTE combined. For example, the SWTE comprising water, sulfuric acid, citric acid, and phosphoric acid will be present in the total bath composition from about 10.0% to about 14.0% by weight. The SWTE comprising water, sulfuric acid, citric acid, phosphoric acid, and water will be present in the total bath composition from about 25.0% to about 34.0% by weight. The SWTE comprising water, sulfuric acid, and DTPMP will be present in the total bath composition from about 5.0% to about 7.5% by weight. The SWTE comprising water, sulfuric acid, DTPMP, and boric acid will be present in the total bath composition from about 26.0% to about 32.0% by weight. The SWTE comprising water, sulfuric acid, citric acid, DTPMP, and phosphoric acid will be present in the total bath composition from about 8.0% to about 12.0% by weight. The SWTE comprising water, sulfuric acid, citric acid, DTPMP, phosphoric acid, and boric acid will be present in the total bath composition from about 29.0% to about 35.0% by weight.

The SWTE therefore makes up from about 5.0% to about 35.0% of the total bath composition by weight. The SWTE, in turn, includes about 1.50% to about 7.50% by weight of sulfuric acid. Given the dilution of the SWTE in the total bath composition, sulfuric acid is present from about 0.30% to about 1.00% by weight of the total bath composition, preferably from about 0.40% to about 0.90% by weight of the total bath composition. A reduction in the amount of sulfuric acid is beneficial because of a lower environmental burden, as well as a reduction in the heat that is released upon mixing the components, requiring less cooling to achieve the desired reaction temperature.

With further reference to the drawings, FIG. 1 is a ternary plot graphically depicting the ratios of three variables, and their effect on the etch process window. The three variables are hydrofluoric acid (shown as HF on the right side of the triangle), nitric acid (shown as $HNO_3$ on the left side of the triangle), and the SWTE (shown as the base of the triangle), and the ratios indicate their presence by weight over the total bath composition by weight. In the ternary plot, the proportions of the three variables sum to a constant, 1.0, and every point on a ternary plot represents a different composition of the three components, totaling 1.0.

The concentration of each species is 1.0 (pure phase) at its counterclockwise corner of the triangle and 0.0 at its clockwise corner (i.e., the apex 10 of the triangle is pure (1.0) for hydrofluoric acid, the bottom left corner 20 is pure (1.0) for nitric acid, and the bottom right corner 30 is pure (1.0) for the SWTE). The species decreases linearly as one travels from the species clockwise corner to its counterclockwise corner, as depicted in FIG. 1. The parallel lines shown at regular intervals between the zero line and the corner can be used to determine the content of a particular species. For a given point, the fraction of each of the three materials in the composition can be determined by where the parallel lines meet the corresponding axes for each particular component.

A number of total bath compositions (consisting of UKON etch mix plus the SWTE) were made and used to texture silicon wafers. Each point on the ternary plot represents a silicon wafer textured in a total bath composition, the point the corresponding to the ratio of hydrofluoric acid, nitric acid, and the SWTE in the bath in which the wafer was textured. The points represented by rectangles were appropriately textured. The points represented by circles were over-textured, or polished. The points represented by triangles are characterized as being somewhere between polished and textured. The points represented by ovals are textured, but still exhibited visible saw damage.

The area outlined by the squares therefore represents the process window in which texturing occurs. The points collectively represent an area where the ratio of nitric acid is from about 0.290 to about 0.570, hydrofluoric acid is from about 0.100 to about 0.380, and the SWTE is from about 0.30 to about 0.420. The SWTE therefore enhances the process window so that a ratio of nitric acid to total composition has a delta of about 0.28, and the ratio of hydrofluoric acid to total bath composition has a delta of about 0.28. This is a large process window which provides great flexibility and reliability that the texturing process will efficiently and consistently function. In addition, the etch depth of the wafer is tunable by changing the ratio of the respective components. For instance, by the etch rate can be tuned between 4 and 8 micrometers per side by changing the amount of HF used in the mixture, as indicated in the Figure, when the wafer is contacted with the solution for a time of 1 minute at a temperature of 15° C.

Figure 2:
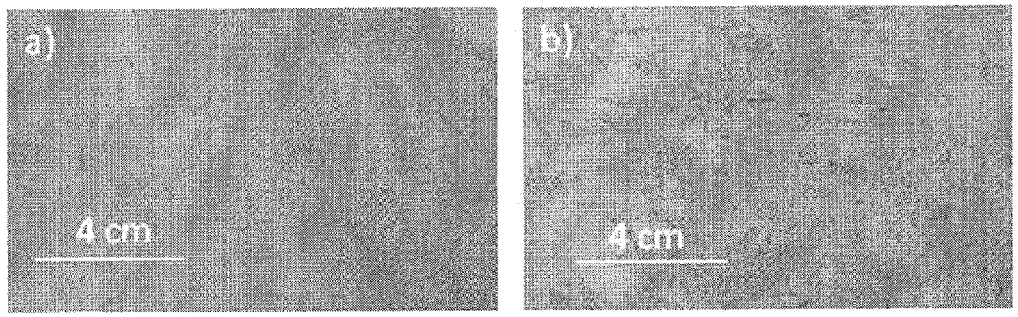
FIG. 2 is photomicrograph of two polycrystalline silicon wafers post-etching wherein b) depicts the defects of prior art etching and a) depicts the homogeneity of a wafer etched with the a composition of the present invention.

With reference to FIG. 2 of the drawings, a comparison is exhibited between a wafer surface obtained using a mixture from patent WO 2011/032880, shown as picture b) on the right side, and a wafer surface obtained using the texturing bath of the present invention, shown as picture a). The texturing bath of the present invention leads to surfaces with barely visible defects and good wafer homogeneity. As a consequence, the charge recombination at the surface is expected to decrease significantly.

EXAMPLES

The present invention is further exemplified, but not limited, by the following representative examples, which are intended to illustrate the invention and are not to be construed as being limitations thereto. Two examples of solutions have been prepared, and their content can be seen in Tables 1 and 2.

Example 1

A silicon wafer texturing enhancer (SWTE) is made by combining 70 mL of 98% sulfuric acid and 450 mL of phosphoric acid (85%) with water and citric acid and heat to make SWTE 1. A UKON etch process bath is prepared using SWTE 1, the total composition of which can be seen in Table 1. This composition is useful to etch a Deutsche Cell silicon wafer.

Example 2

A silicon wafer texturing enhancer (SWTE) is made by combining 70 mL of 98% sulfuric, 450 mL of phosphoric acid, water, citric acid, boric acid together and heat to make SWTE 2. A UKON etch process bath is prepared using SWTE 2, the total composition of which can be seen in Table 2. This composition is useful to etch a Deutsche Cell silicon wafer.

TABLE 1

| Total Bath Composition with SWTE 1 | Volume (mL) | Volume % | Density (g/mL) | Weight for 15 L (g) | Weight % |
|---|---|---|---|---|---|
| $H_2O$ | 4580 | 29.644 | 1 | 4580 | 23.714 |
| HF(49%) | 3450 | 22.330 | 1.15 | 3967.5 | 20.543 |
| $HNO_3$ (65%) | 6900 | 44.660 | 1.41 | 9729 | 50.374 |
| $H_2SO_4$ (98%) | 70 | 0.453 | 1.84 | 128.8 | 0.667 |
| Citric acid | | | | 150 | 0.777 |
| Phosphoric acid (85%) | 450 | 2.913 | 1.685 | 758.25 | 3.926 |
| Total | 15450 | 100 | | 19313.55 | 100 |

TABLE 2

| Total Bath Composition with SWTE 2 | Volume (mL) | Volume % | Density (g/mL) | Weight for 15 L (g) | Weight % |
|---|---|---|---|---|---|
| $H_2O$ | 4580 | 29.644 | 1 | 4580 | 23.531 |
| HF(49%) | 3450 | 22.330 | 1.15 | 3967.5 | 20.384 |
| $HNO_3$ (65%) | 6900 | 44.660 | 1.41 | 9729 | 49.986 |
| $H_2SO_4$ (98%) | 70 | 0.453 | 1.84 | 128.8 | 0.662 |
| Citric acid | | | | 150 | 0.771 |
| Boric acid | | | | 150 | 0.771 |
| Phosphoric acid (85%) | 450 | 2.913 | 1.685 | 758.25 | 3.896 |
| Total | 15450 | 100 | | 19463.55 | 100 |

In the composition of Table 1, about 6% by weight sulfuric acid is present in the SWTE, and about 0.667% by weight sulfuric acid is present in the total bath composition. About 8% by weight citric acid is present in the SWTE, and about 0.777% by weight citric acid is present in the total bath composition. About 40% by weight phosphoric acid is present in the SWTE, and about 3.926% by weight phosphoric acid is present in the total bath composition. Water is present at about 44% of the SWTE by weight, and about 23.714% of the total bath composition.

In the composition of Table 2, about 2% by weight sulfuric acid is present in the SWTE, and about 0.667% sulfuric acid by weight is present in the total bath composition. About 2.6% by weight citric acid is present in the SWTE, and about 0.771% citric acid by weight is present in the total bath composition. About 13% by weight phosphoric acid is present in the SWTE, and about 3.896% phosphoric acid by weight is present in the total bath composition. About 2.6% by weight boric acid is present in the SWTE, and about 0.771% by weight is present in the total bath composition. About 80% by weight water is present in the SWTE, and about 23.531% water by weight is present in the total bath composition.

The formulations in Table 1 and Table 2 are inventive formulations showing SWTE 1 and SWTE 2 augmenting UKON bath compositions, to form two total bath compositions. The modification of the UKON bath composition with SWTE 1 and SWTE 2 enhances the texturing process as detailed herein to create solar cells with greater overall efficiency. The beneficial results of such SWTEs are demonstrated in the phase diagram of FIG. 1, as well as the textured wafer of FIG. 2.

Thus while there have been described what are presently believed to be preferred embodiments of the invention, those skilled in the art will realize that changes and modifications may be made thereto without departing from the spirit of the invention, and it is intended to claim all such changes and modifications as fall within the true scope of the invention.

What is claimed is:

1. A silicon wafer texturing enhancer (SWTE) for use in a UKON etch process, comprising a multi-component process window enhancer in an aqueous system in an amount sufficient to optimize the processing window in a UKON etch process.

2. The silicon wafer texturing enhancer (SWTE) according to claim 1 further comprising an etch defect passivator.

3. The silicon wafer texturing enhancer (SWTE) according to claim 1 wherein said UKON etch process includes a UKON etch composition comprising a hydrofluoric acid/nitric acid mixture and water.

4. The silicon wafer texturing enhancer (SWTE) according to claim 1 wherein said UKON etch process composition has a ratio of hydrofluoric acid/nitric acid of from about 0.250 to about 0.550.

5. The silicon wafer texturing enhancer (SWTE) according to claim 1 wherein said multi-component process window enhancer comprises sulfuric acid and at least one of phosphoric acid or DTPMP.

6. The silicon wafer texturing enhancer (SWTE) according to claim 5 wherein said multi-component process window enhancer comprises sulfuric acid and phosphoric acid.

7. The silicon wafer texturing enhancer (SWTE) according to claim 5 wherein said multi-component process window enhancer comprises sulfuric acid and DTPMP.

8. The silicon wafer texturing enhancer (SWTE) according to claim 2 further comprising citric acid.

9. The silicon wafer texturing enhancer (SWTE) according to claim 1 comprising water, sulfuric acid, citric acid, and phosphoric acid.

10. The silicon wafer texturing enhancer (SWTE) according to claim 9 wherein sulfuric acid comprises from about 3.00% to about 11.00% by weight of the SWTE, citric acid comprises from about 4.00% to about 12.00% by weight of the SWTE, phosphoric acid comprises from about 35.00% to about 45.00% by weight of the SWTE, and water comprises from about 40.00% to about 50.00% by weight of the SWTE.

11. The silicon wafer texturing enhancer (SWTE) according to claim 9 additionally comprising boric acid.

12. The silicon wafer texturing enhancer (SWTE) according to claim 11 wherein sulfuric acid comprises from about 1.00% to about 3.25% by weight of the SWTE, citric acid comprises from about 1.50% to about 3.75% by weight of the SWTE, phosphoric acid comprises from about 8.00% to about 18.00% by weight of the SWTE, boric acid comprises from about 1.50% to about 3.75% by weight of the SWTE, and water comprises from about 74.00% to about 84.00% by weight of the SWTE.

13. The silicon wafer texturing enhancer (SWTE) according to claim 1 comprising water, sulfuric acid, and DTPMP.

14. The silicon wafer texturing enhancer (SWTE) according to claim 13 wherein sulfuric acid comprises from about 3.00% to about 11.00% by weight of the SWTE, DTPMP comprises from about 40.00% to about 54.00% by weight of the SWTE, and water comprises from about 39.00% to about 51.00% by weight of the SWTE.

15. The silicon wafer texturing enhancer (SWTE) according to claim 13 additionally comprising boric acid.

16. The silicon wafer texturing enhancer (SWTE) according to claim 15 wherein sulfuric acid comprises from about 1.25% to about 3.25% by weight of the SWTE, DTPMP comprises from about 11.00% to about 19.00% by weight of the SWTE, boric acid comprises from about 1.50% to about 3.75% by weight of the SWTE, and water comprises from about 70.00% to about 88.00% by weight of the SWTE.

17. The silicon wafer texturing enhancer (SWTE) according to claim 1 comprising water, sulfuric acid, citric acid, DTPMP, and phosphoric acid.

18. The silicon wafer texturing enhancer (SWTE) according to claim 17 wherein sulfuric acid comprises from about 2.00% to about 6.00% by weight of the SWTE, citric acid comprises from about 2.25% to about 6.50% by weight of the SWTE, phosphoric acid comprises from about 19.00% to about 29.00% by weight of the SWTE, DTPMP comprises from about 22.00% to about 32.00% by weight of the SWTE, and water comprises from about 35.00% to about 45.00% by weight of the SWTE.

19. The silicon wafer texturing enhancer (SWTE) according to claim 17 additionally comprises boric acid.

20. The silicon wafer texturing enhancer (SWTE) according to claim 19 wherein sulfuric acid comprises from about 1.25% to about 2.75% by weight of the SWTE, citric acid comprises from about 1.50% to about 3.25% by weight of the SWTE, phosphoric acid comprises from about 6.00% to about 16.50% by weight of the SWTE, DTPMP comprises from about 8.00% to about 18.00% by weight of the SWTE, boric acid comprises from about 1.50% to about 2.25% by weight of the SWTE, and water comprises from about 58.00% to about 78.00% by weight of the SWTE.

21. A method of chemically texturing a surface of a polycrystalline silicon wafer, said method comprising contacting said surface of said polycrystalline silicon wafer with a composition for a time and at a temperature sufficient to texturize said wafer surface, said composition comprising first and second components, wherein said first component comprises a hydrofluoric acid/nitric acid mixture and water, and said second component comprises a silicon wafer texturing enhancer (SWTE).

22. The method according to claim 21 wherein the surface of the wafer is contacted with said composition at a temperature of about 2° C. to about 30° C. for a period of time of about 20 seconds to about 90 seconds.

23. The method according to claim 21 wherein the surface of the wafer is contacted with said composition at a temperature of about 12° C. to about 16° C. for a period of time of about 30 seconds to about 60 seconds.

24. A composition for chemical texturing a surface of a polycrystalline silicon wafer, said composition comprising first and second components, wherein said first component comprises a hydrofluoric acid/nitric acid mixture and water, and said second component comprises a silicon wafer texturing enhancer (SWTE).

* * * * *